United States Patent
Conte

(10) Patent No.: US 6,407,542 B1
(45) Date of Patent: Jun. 18, 2002

(54) IMPLEMENTATION OF A MULTI-PORT MODAL DECOMPOSITION SYSTEM

(75) Inventor: Robert Alfred Conte, Township of Manalapan, NJ (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/534,415

(22) Filed: Mar. 23, 2000

(51) Int. Cl.[7] ............................................. G01R 31/28
(52) U.S. Cl. ...................... 324/158.1; 324/540; 324/66
(58) Field of Search ........................... 324/158.1, 761, 324/619, 765, 538, 551, 540, 66; 73/431; 439/148, 578, 584; 124/78; 118/715, 718, 725

(56) References Cited

U.S. PATENT DOCUMENTS

| | | | | |
|---|---|---|---|---|
| 4,173,384 A | * | 11/1979 | Phillips | |
| 4,574,236 A | * | 3/1986 | Hechtman | |
| 4,688,877 A | * | 8/1987 | Dreyer | |
| 4,720,275 A | * | 1/1988 | Swart | |
| 4,734,046 A | * | 3/1988 | McAllister | |
| 5,018,316 A | * | 5/1991 | Mulholland | |
| 5,127,853 A | * | 7/1992 | McMills | |
| 5,181,859 A | * | 1/1993 | Foreman | |
| 5,338,213 A | * | 8/1994 | Oko | |
| 5,432,301 A | * | 7/1995 | Gehring | |
| 5,642,054 A | * | 6/1997 | Pasiecznik | |
| 6,170,329 B1 | * | 1/2001 | Steketee | |

* cited by examiner

Primary Examiner—Michael J. Sherry
Assistant Examiner—Trung Q. Nguyen

(57) ABSTRACT

A mechanical fixture for providing a rigid connection between a multi conductor cable or other connecting hardware and measurement equipment is disclosed. The fixture includes a test head consisting of a plurality of unbalanced ports which are contained in a generally circular area whose diameter is close to that of the cable to be tested. As a result, fan out of the conductors at the point where they connect to the ports in the test head, which can corrupt measured data, is minimized. The test head is rigidly connectable to a network analyzer, preferably by the use of a removable "snap" connection. Additional ports on the test head can be provided for use during a calibration process. An electrical cap is provided for holding the conductor ends in place. The cap mates with the test head to rigidly connect the conductor to the measurement ports while retaining the "fanned out" portion of the cable in a rigid and known configuration. A slidable shield is provided which extends from within the test head and serves to electrically isolate the individual pairs of conductors in the fan-out region of the cable from each other. The rigid mechanical connections between the DUT and the measurement equipment advantageously provides the low noise floor and reproducibility needed to achieve precise test results.

21 Claims, 19 Drawing Sheets

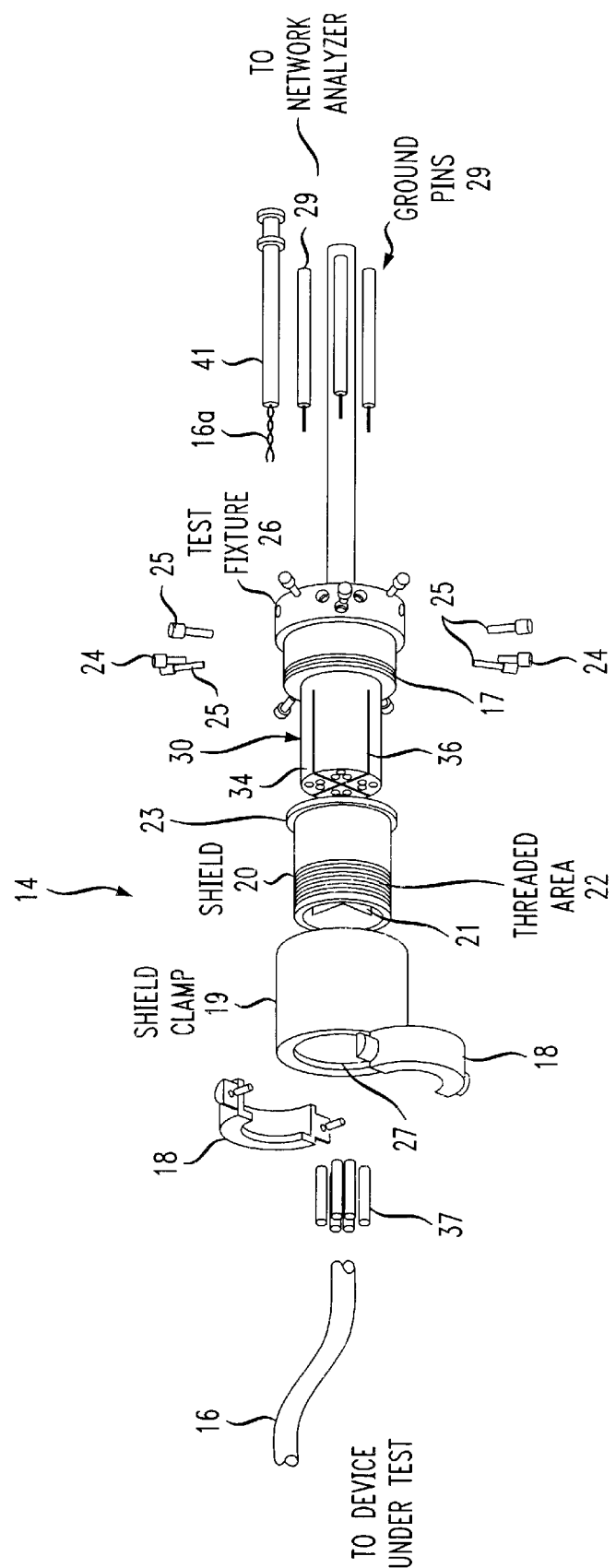

SECTION C-C

SECTION A-A

SECTION B-B

IMPLEMENTATION OF A MULTI-PORT MODAL DECOMPOSITION SYSTEM

BACKGROUND OF THE INVENTION

1. Field of the Invention

The present invention generally relates to the measurement of the electrical characteristics of a twisted-pair cable and, more particularly, to a multi-port mechanical system for twisted pair cable applications.

2. Description of the Related Art

When using and designing high frequency multiport networks, such as data cables and connecting hardware, it is often necessary to characterize both the differential performance as well as the common mode performance of the data interface. With the recent increase in operating frequencies, there has arisen a very strong need to understand the high frequency coupling between the various modes of propagation within cables and connecting hardware. Unfortunately, test and measurement hardware suitable for use at low frequencies is unsuitable at the frequencies presently contemplated because previously disregardable errors become significant.

Errors associated with network analyzer measurements can result from either non-ideal conditions in the measurement equipment or from the effects of the mechanical fixtures, such as cables and connectors, which are required to connect a device under test (DUT) to the test equipment. With particular respect to the mechanical fixtures, errors can result from motion of the fixture between measurements, coupling between fixtures, and coupling between conductors from the twisted pair cable in the fanout region (i.e., where the conductors are untwisted so they can be connected to the input ports of the network analyzer). Although these errors are relatively minor at low frequencies, at high frequencies, they corrupt calibration and measurement data to an undesired degree.

Conventionally, the differential performance of a system has been measured by connecting a balun to each port of the system while using a network analyzer to determine the actual performance parameters. Such a balun is disclosed in U.S. Pat. No. 4,717,896 to Graham which discloses a balun for intercoupling a partially unbalanced line with a substantially balanced line having similar line impedances. The balun is capable of passing differential signals over a wide bandwidth while substantially attenuating any common mode signals. The disadvantage of this approach is that the balun itself corrupts the measurement. Bandwidth limitations limit the frequency range of the measurement and imbalances in the balun contaminate differential mode signals used to probe the various ports of the DUT. Additionally, when attempting to determine coupling related to various modes of propagation, balun characteristics need to be subtracted from the measurements. To date, no credible procedure has been developed to accomplish this type of calibration.

In addition to the problems associated with baluns, conventional systems and methods for determining the performance parameters of cables and connecting hardware do not possess the precision necessary to extract all of the coupling parameters. Specifically, mode conversions are not measured accurately. Further, the conventional fixtures used to connect the DUT to the measurement device are unrefined and corrupt the measurements at high frequencies. Compounding these deficiencies is the inadequacy of the calibration procedures used to compensate for imperfections of the fixtures.

Conventional systems also fail to provide mechanical fixtures which minimize pair fan out when connecting a twisted-pair cable to the measurement system. In addition, due to the flexible nature of the mechanical fixtures of the conventional systems, it is difficult to reproduce measurements accurately. Because of these deficiencies, conventional systems are incapable of utilizing calibration equipment which can overcome the deficiencies of the presently available measurement procedures. As a result, conventional systems fail to adequately measure differential and common mode return loss, crosstalk, attenuation and mode conversions between differential and common mode signals in a DUT, such as a twisted-pair cable.

A conventional modal decomposition system is the Hewlett Packard 4380s measurement system. While suitable for some differential measurements, this unit cannot be accurately calibrated for measurements involving common mode parameters. Further, the mechanical fixtures provided with this system to connect the DUT to the analyzer ports are inadequate for high frequency applications and the coupling cables are free to move during the calibration processes. As a result, the noise floor is substantially corrupted and it is difficult to obtain reproducible measurements at high frequencies. Moreover, the symmetries expected in the measurement of reciprocal networks are absent, thus further indicating measurement problems. Finally, this system cannot measure mode conversions in high frequency systems.

It would therefore be advantageous to provide a system for making appropriate measurements of the high frequency characteristics of a DUT, e.g., a twisted cable, which does not suffer from errors present in conventional measurement systems.

SUMMARY OF THE INVENTION

The above and other problems are overcome in a multi-port modal decomposition system which provides a rigid interconnection between a DUT and a network analyzer. The multi-port modal decomposition system is a mechanical device which may be used both during calibration measurements and when measuring the high frequency characteristics of various electrical components.

According to the invention, a novel mechanical fixture is used to provide a rigid connection between a multi-conductor cable or other connecting hardware and measurement equipment. The fixture includes a test head consisting of a plurality of unbalanced ports which are contained in a generally circular area whose diameter is close to that of the cable to be tested. As a result, fan out of the conductors at the point where they connect to the ports in the test head, which can corrupt measured data, is minimized. The test head is rigidly connectable to a multiport RF switching network, preferably by the use of a removable "snap" connection. Additional ports on the test head can be provided for use during a calibration process.

In one embodiment of the invention, an electrical cap is provided for holding the conductor ends in place. The cap mates with the test head to rigidly connect the conductor to the measurement ports while retaining the "fanned out" portion of the cable in a rigid and known configuration. In a further embodiment, a slidable shield is provided which extends from within the test head and serves to electrically isolate the individual pairs of conductors in the fan-out region of the cable from each other. The rigid mechanical connections between the DUT and the measurement equipment advantageously provides the low noise floor and reproducibility needed to achieve precise results.

BRIEF DESCRIPTION OF THE DRAWINGS

The foregoing and other advantages and features of the invention will become more apparent from the detailed description of the preferred embodiment of the invention given below with reference to the accompanying drawings in which:

FIG. 3 is an exploded perspective view of a particular test fixture subassembly according to the invention;

DETAILED DESCRIPTION OF THE PREFERRED EMBODIMENTS

Figure 1:
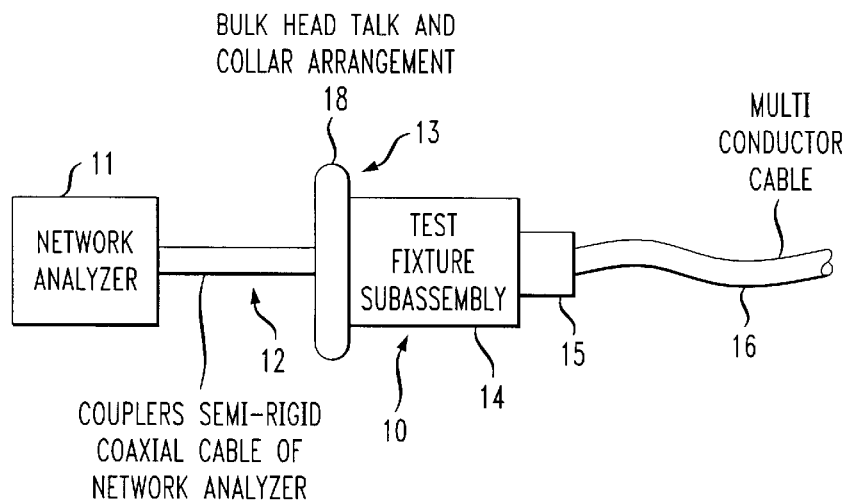
FIG. 1 is a schematic block diagram of a mechanical fixture according to the invention.

FIG. 1 illustrates, in schematic block diagram form, a mechanical fixture 10 according to a preferred embodiment of the invention. The mechanical fixture 10 has two primary portions, a bulk head jack and collar arrangement 18 configured to rigidly attach to a network analyzer 11 and a test fixture subassembly 14 configured to rigidly receive a device under test (DUT), such as a twisted-pair cable 16 through an insulating clamp 15. Once assembled, the mechanical fixture 10 is rigid and therefore provides the ability to reproduce accurate measurements.

Figure 2:
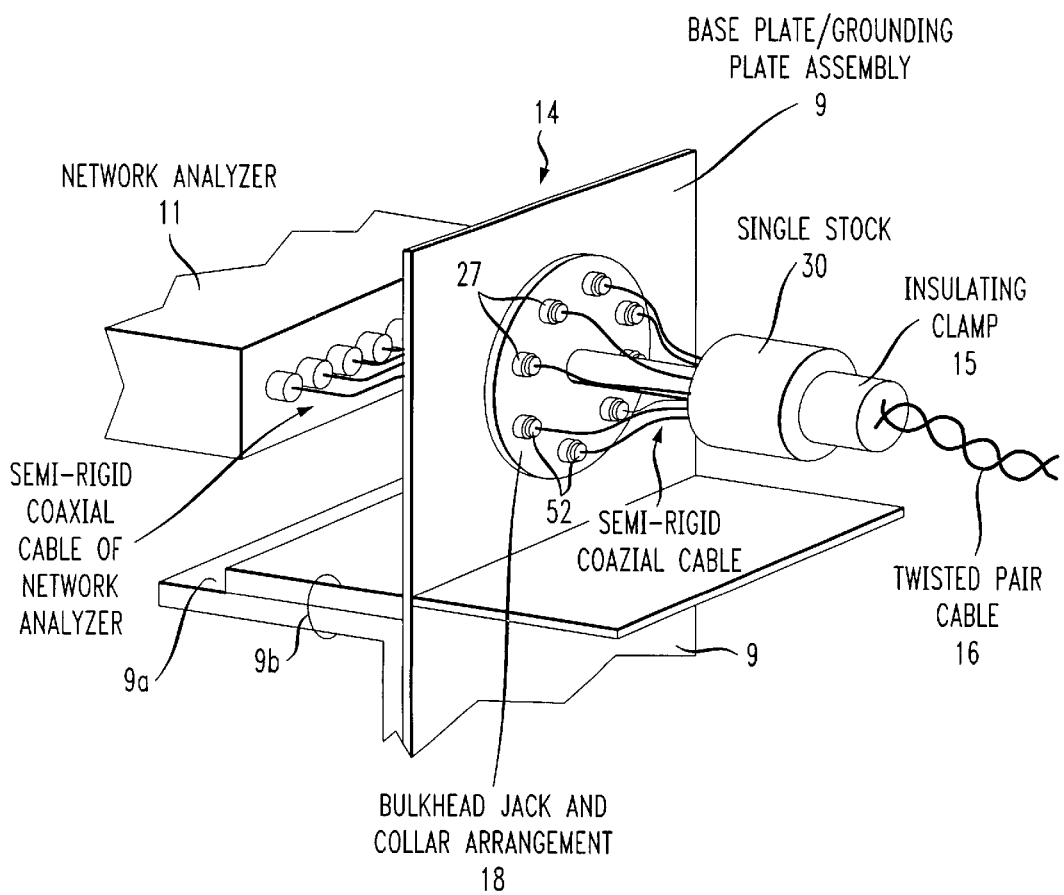
FIG. 2 is a schematic illustration of the test fixture subassembly mounted to a baseplate/grounding plate assembly in a preferred embodiment.
Figure 11:
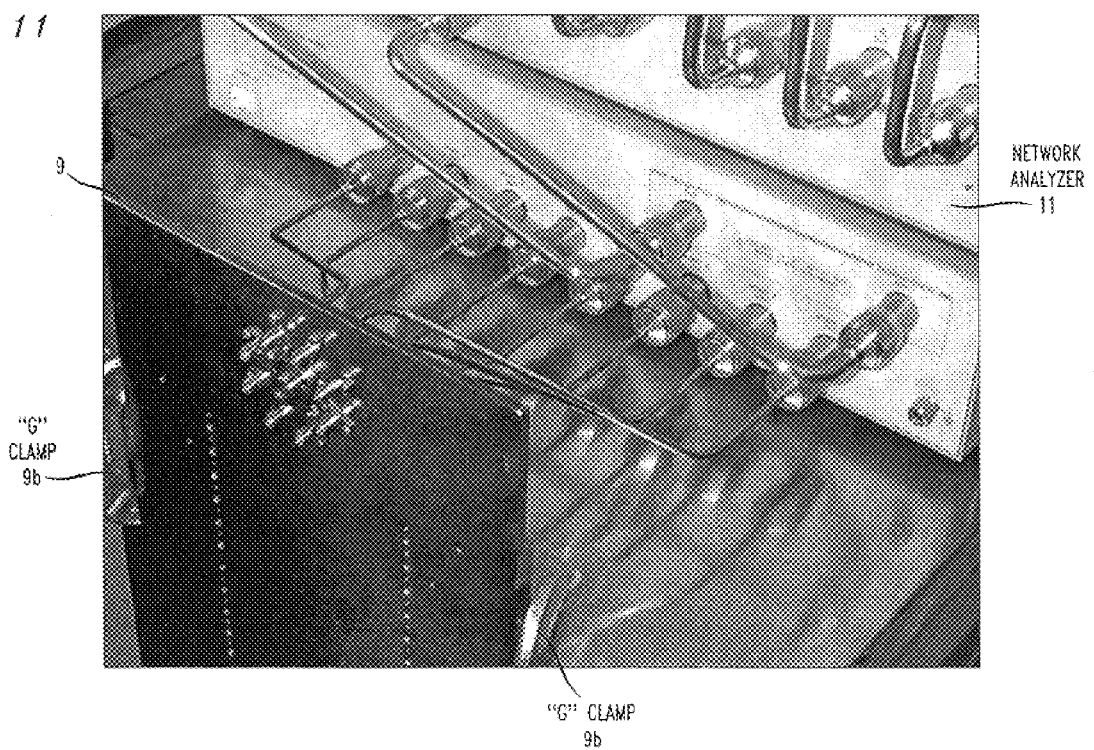
FIG. 11 is a perspective view of the baseplate/grounding assembly connected to a network analyzer via semi-rigid coaxial cables.
Figure 12:
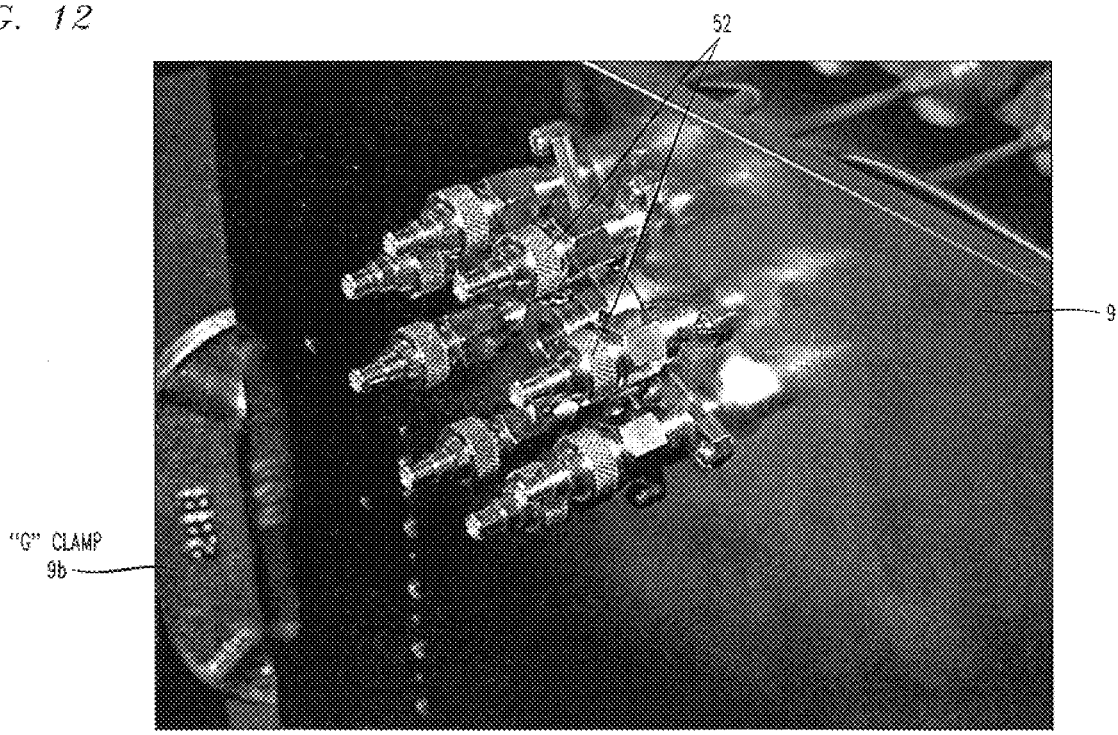
FIG. 12 is a perspective view of male SMA to MCX adaptors mounted to the baseplate/grounding assembly.
Figure 16:
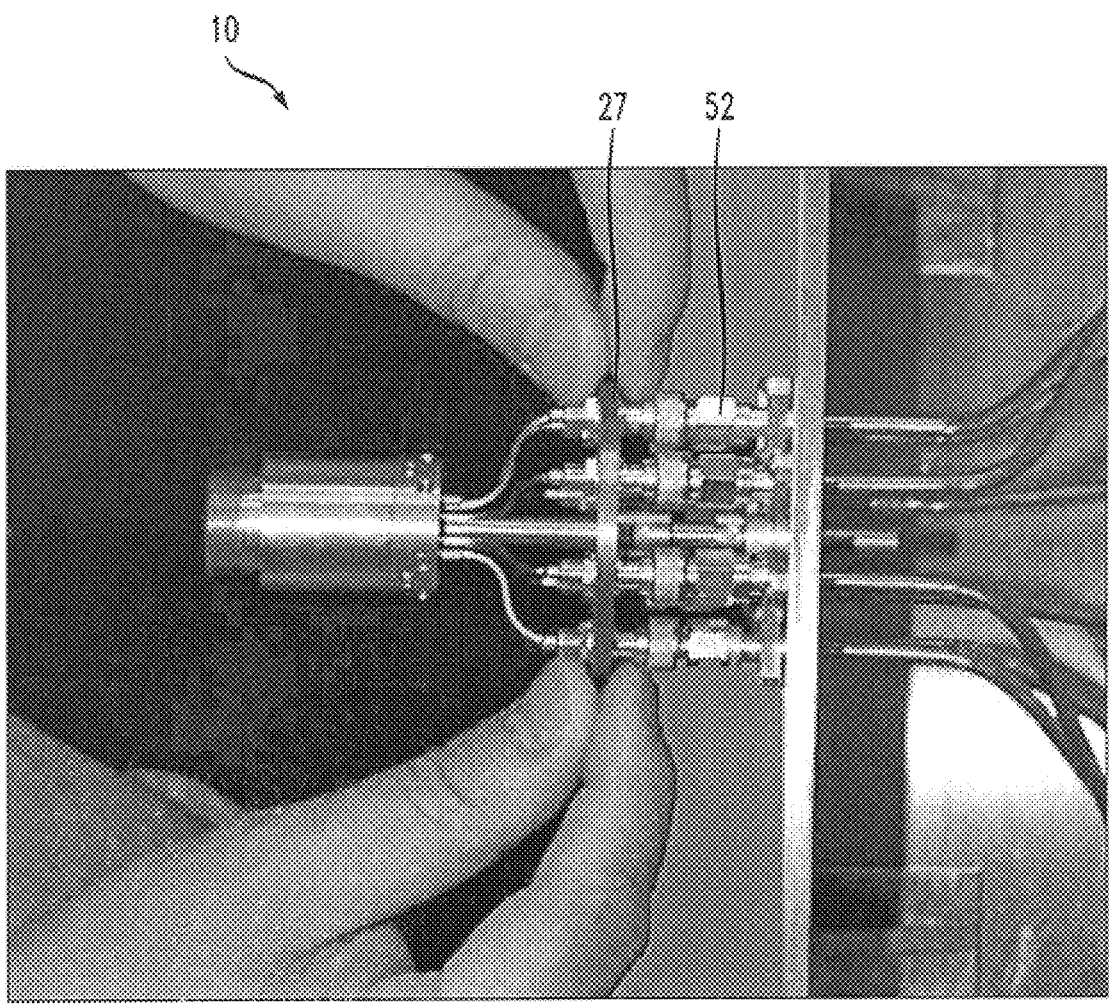
FIG. 16 is a top view of the mechanical fixture of FIG. 13 mounted to the baseplate/grounding assembly of FIG. 11.
Figure 17:
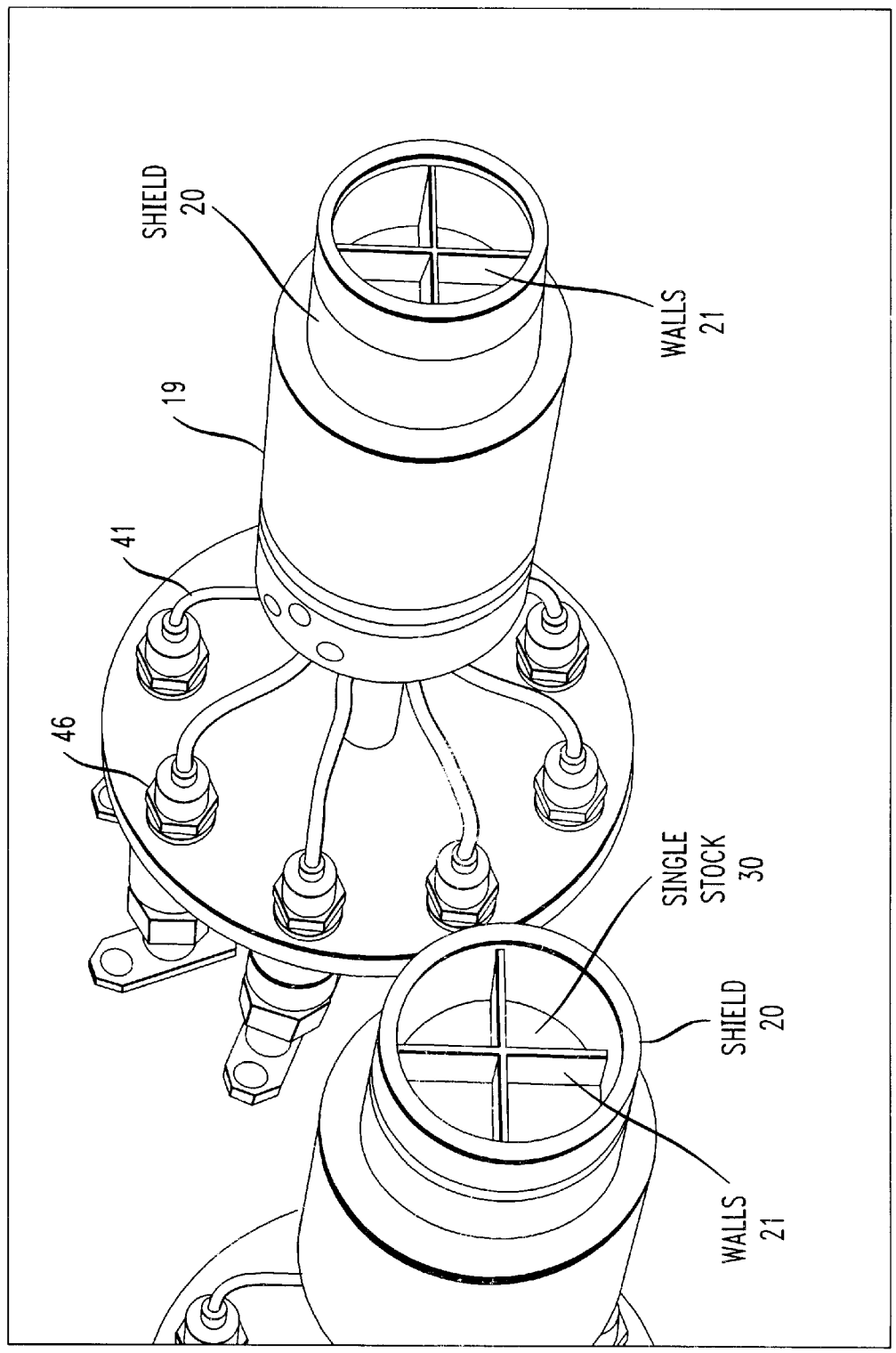
FIG. 17 is a perspective view of the mechanical fixture of FIG. 13 mounted to the baseplate/grounding assembly of FIG. 11.

FIG. 2 is an illustration of the test fixture subassembly 14 mounted to a baseplate/grounding plate assembly 9 in a preferred embodiment. Attached in a circular arrangement to the baseplate/grounding plate assembly 9 are male SMA to MCX adapters 52 (as shown in more detail in FIG. 12 and FIG. 16). In the preferred embodiment, eight male adapters are used. The male adapters 52 mate with female MCX connectors 27 located on the bulk head jack and collar arrangement 18 (see FIG. 16). During use, the mechanical fixture 10 is mounted to the base plate/grounding plate assembly 9 which is fixedly positioned relative to the network analyzer 11 by means of a removable "snap" connection, as shown in FIG. 16. The base plate and grounding plate 9 can be secured to a test bench 9a in a manner readily apparent to one skilled in the art (e.g., "G" clamps 9b as shown in more detail in FIG. 11) such that mechanical fixture 10 is fixedly coupled to the test bench 9a via the baseplate/grounding plate assembly 9. In this manner, the mechanical fixture 10 is rigidly held in place during testing or calibration measurements, and the accurate reproduction of measurements is achieved.

FIG. 3 is an exploded view of one embodiment of the test fixture subassembly 14. The test fixture subassembly 14 comprises, inter alia, a test fixture 26, a shield clamp 19 and a shield 20. These components are made of rigid materials, preferably brass or another material having a high conductivity. The test fixture 26 is used to rigidly interconnect a DUT to a network analyzer 11. The shield 20 and shield clamp 19 are used to electrically isolate pairs of conductors from each other in the twisted pair cable 16 when they are fanned out to connect the cable 16 to the test fixture 26.

Figure 4A:
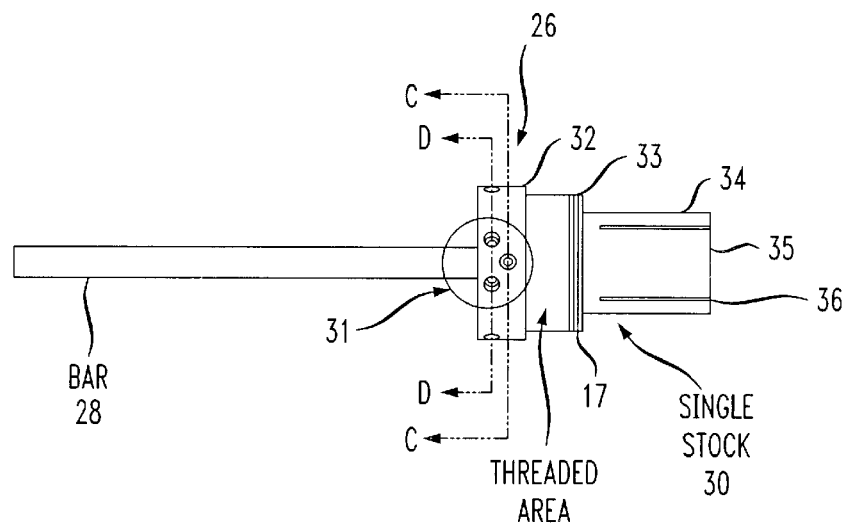
FIG. 4(a) is a side view of a portion of the test fixture of FIG. 3.
Figure 4B:
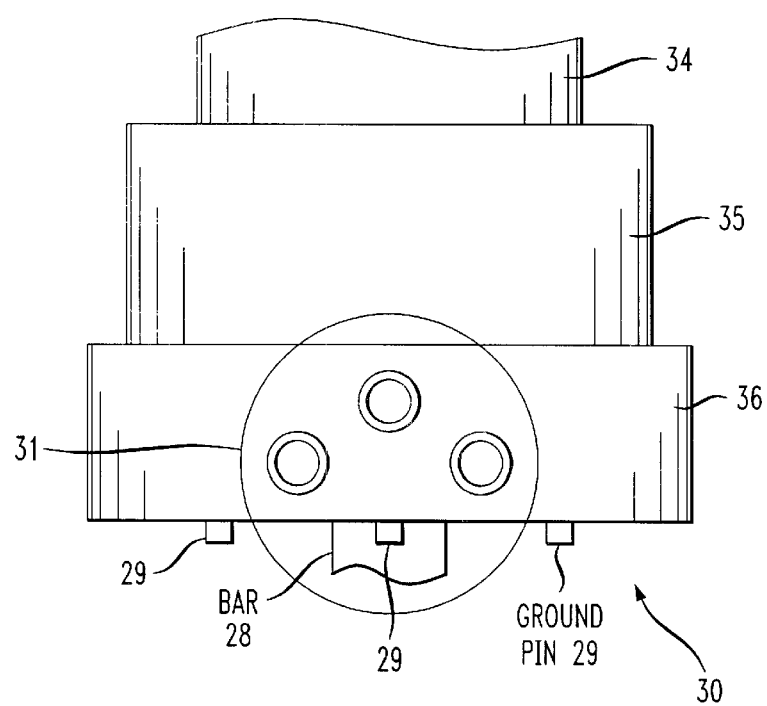
FIG. 4(b) is an enlarged view of a portion of the test fixture shown in FIG. 4(a)
Figure 4C:
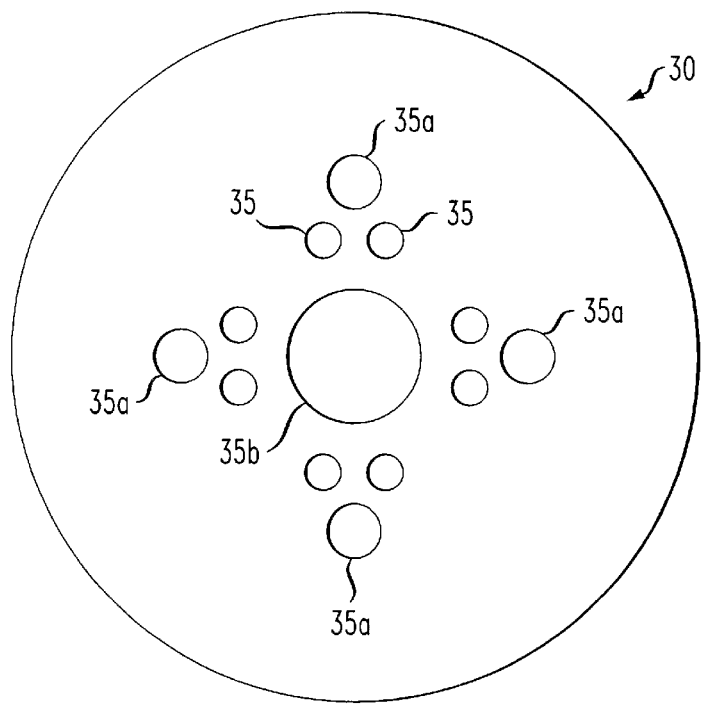
FIG. 4(c) is a rear view of the portion of the fixture of FIG. 4(a)

FIG. 4(a) illustrates a side view of the test fixture 26 which includes the single stock 30 and a removable bar 28. This single stock 30 has three surfaces whose diameters decrease in size (in relationship to each other), and are arranged in a concentric manner in order to receive the shield 20 as shown in FIG. 3. The first surface 32 has the largest diameter of the three surfaces. Preferably, positioned on the outer circumference of the first surface 32 (as shown in FIG. 4(b)) is at least one arrangement of holes 31, which receive clamping screws 24, 25 shown in FIG. 3 which are used to secure or retain semi-rigid coaxial cables 41 and ground pins 29 inserted at the rear of the single stock 30 (shown in FIG. 4(c)) into wire receiving holes 35 and ground pin holes 35a which each extend through the test fixture 26. Upon insertion into ground pin holes 35a, the ground pins 29 slightly protrude from the rear of the single stock 30 (as shown in FIG. 4b)). The removable bar 28 of fixture 26 is also screwed into hole 35b at the rear of single stock 30.

In the preferred embodiment of the invention, a total of eight semi-rigid coaxial cables 41 are used, i.e., one in each of eight wire receiving holes 35 of the single stock 30. Each semi-rigid coaxial cable 41 has a female MCX connector 42 attached at one end, and is stripped to expose the internal wire at the other end. The stripped end of the cable 41 with a precision connector 16a is inserted into the wire receiving holes 35 and is held in place by screws 25 placed into hole 31, as illustrated in FIGS. 3 and 4(a).

Figure 9:
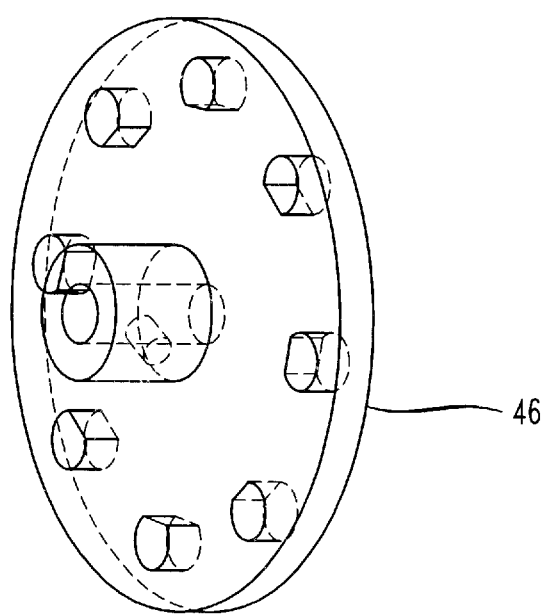
FIG. 9 is a perspective illustration of a bulkhead jack and collar assembly for use with a fixture according to the present invention.
Figure 13:
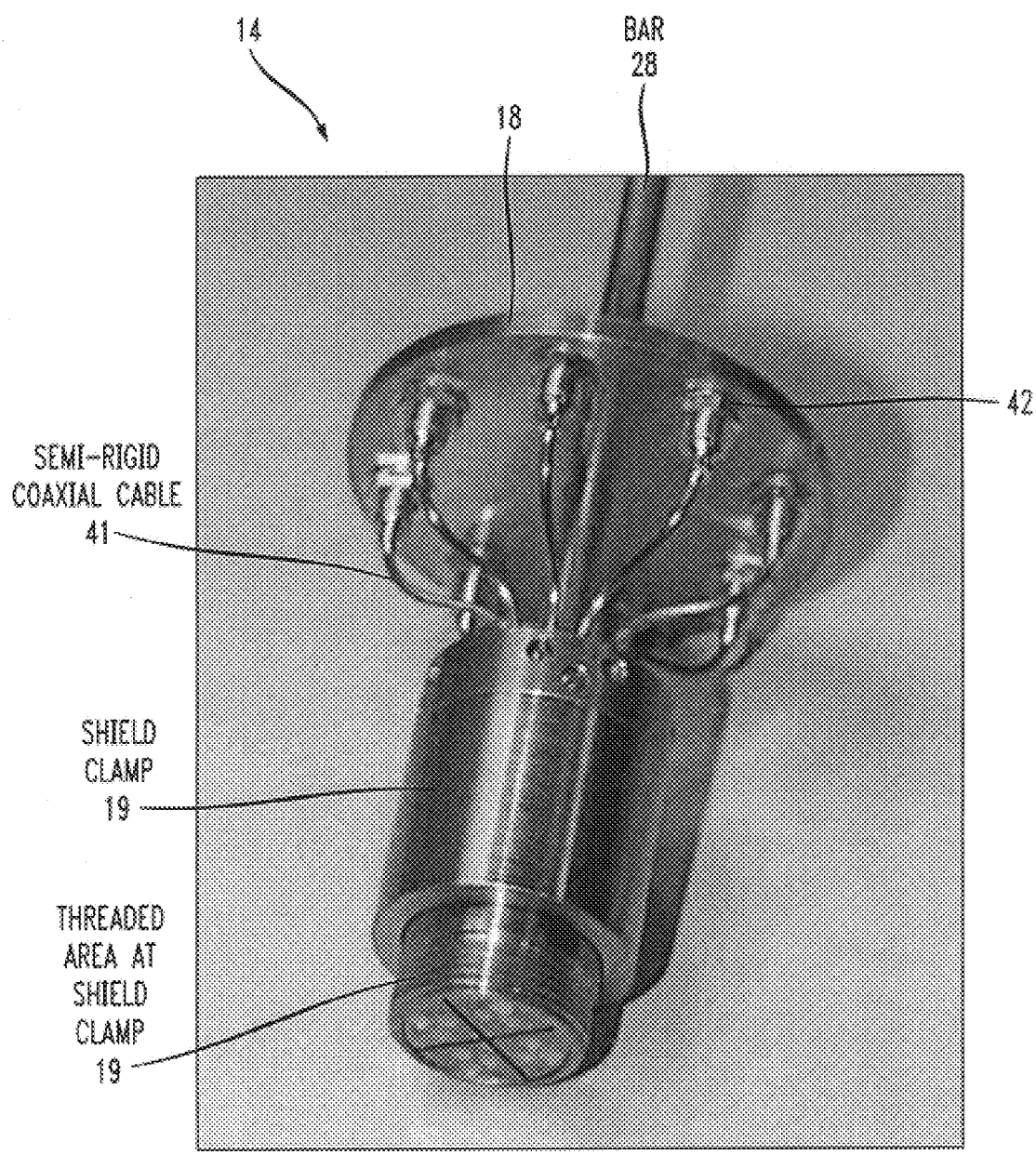
FIG. 13 is a perspective view of the mechanical fixture according to the invention.

Each female MCX connector 42 of the semi-rigid coaxial cable 41 is anchored in a fixed location on the bulkhead jack and collar arrangement 18 of FIG. 2 (as shown in more detailed in FIG. 9 and FIG. 13). The coaxial cables 41 are anchored in a manner which is readily apparent to one of ordinary skill in the art (such as shown in FIG. 13) and is therefore not discussed, here. Disposed in a circular manner in the bulkhead 18 are holes for receiving each semi-rigid coaxial cable 41. The bulkhead jack and collar arrangement 18 also has a centrally located hole through which the removable bar 28 of the test fixture 26 is inserted to retain the bulkhead 18 in a fixed and rigid relationship with the baseplate/grounding plate assembly 9. Once all of the components of the test fixture subassembly 14 are brought together, a mechanical arrangement having mechanical stability (i.e., rigid) is obtained.

As shown in FIG. 4(a), the second surface 33 of stock 30 has a threaded area X for receiving the shield clamp 19. The third surface area 34, which has the smallest diameter of the three surfaces, defines a forward portion of stock 30 that includes the other end of wire receiving holes 35 and ground pin holes 35a.

Figure 4D:
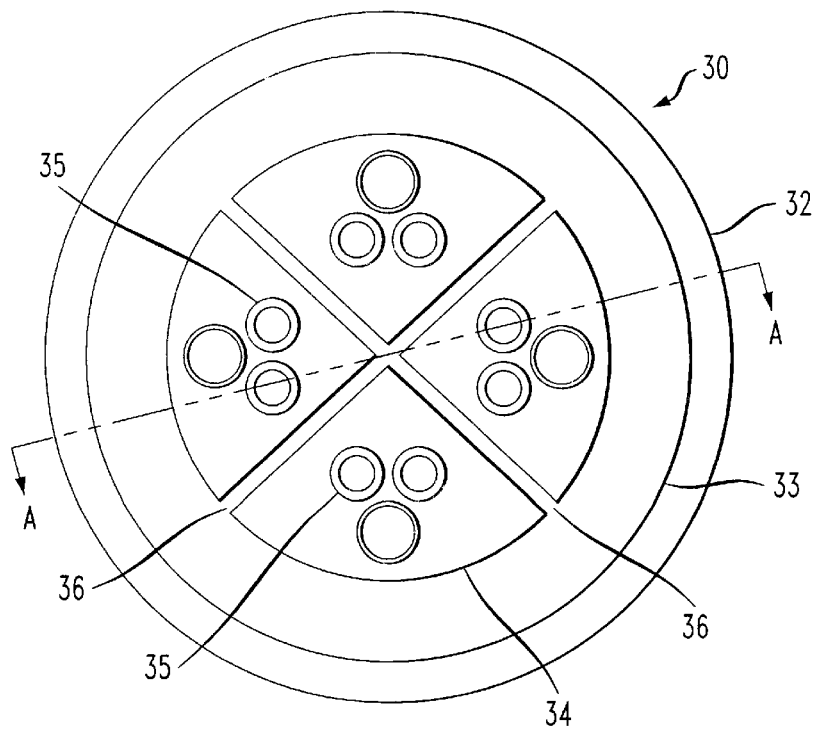
FIG. 4(d) is a front view of the portion of the fixture of FIG. 4(a)
Figure 5A:
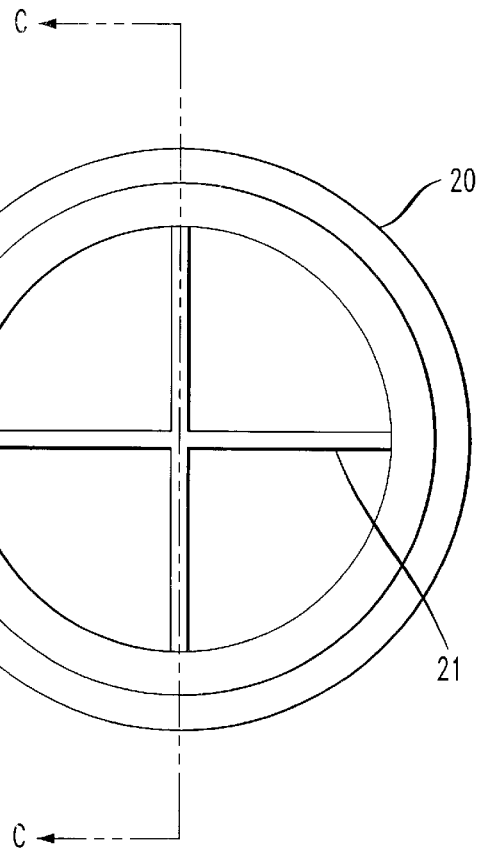
FIG. 5(a) is an end view of the shield according to the present invention.
Figure 5B:
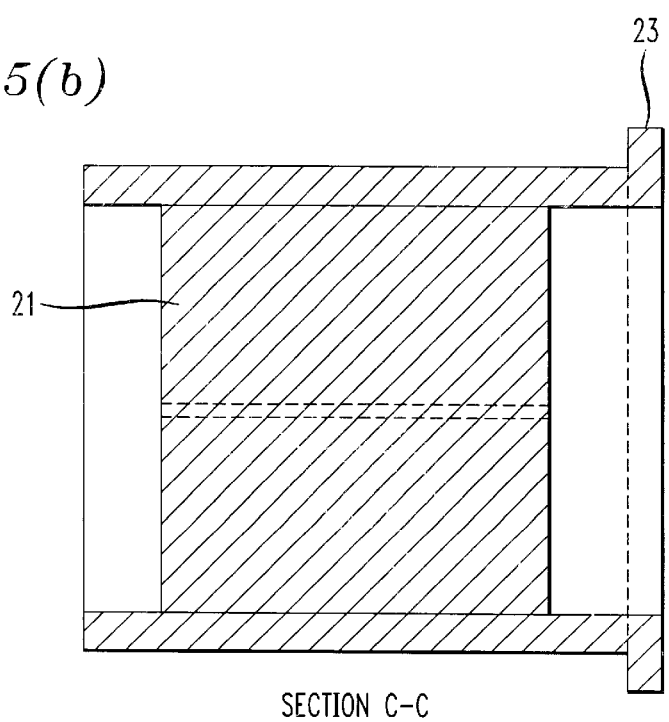
FIG. 5(b) is a cross-sectional view along axis C—C of the shield of FIG. 5(a)

Returning to FIG. 3, the shield 20 is used to provide electrical isolation between the wires of the twisted-pair cable 16 in its untwisted fan-out region between the end of the cable 16 and the test fixture connections. The shield 20 has a threaded area 22 at a first end and a circumferential collar 23 at a second end. Located within the interior of the shield 20 are walls 21 which extend longitudinally within the interior of the shield 20 (see FIGS. 5(a) and 5(b)). The shield 20 fits over the third surface 34 of the test fixture 26, and the walls 21 in the shield 20 mate with corresponding receiving slots 36 (see FIGS. 4(d), 5(a) and 5(b)). The shield 20 and a third surface 34 engage in an axially sliding lockable manner (described below).

Shield clamp 19 has an internal threaded surface (not shown) at one end, and a circumferential lip 27 disposed at an opposite end thereof. The internal threaded surface of the shield clamp 19 engages a threaded area 17 on the second surface 33 of the single stock 30 in a screw type manner. The circumferential lip 27 engages with the rear circumferential collar 23 of the shield 20 to lock the shield 20 in place, preventing it from being removed from the single stock 30 after it is axially slid onto the third surface 34 of the single stock 30.

Figure 4E:
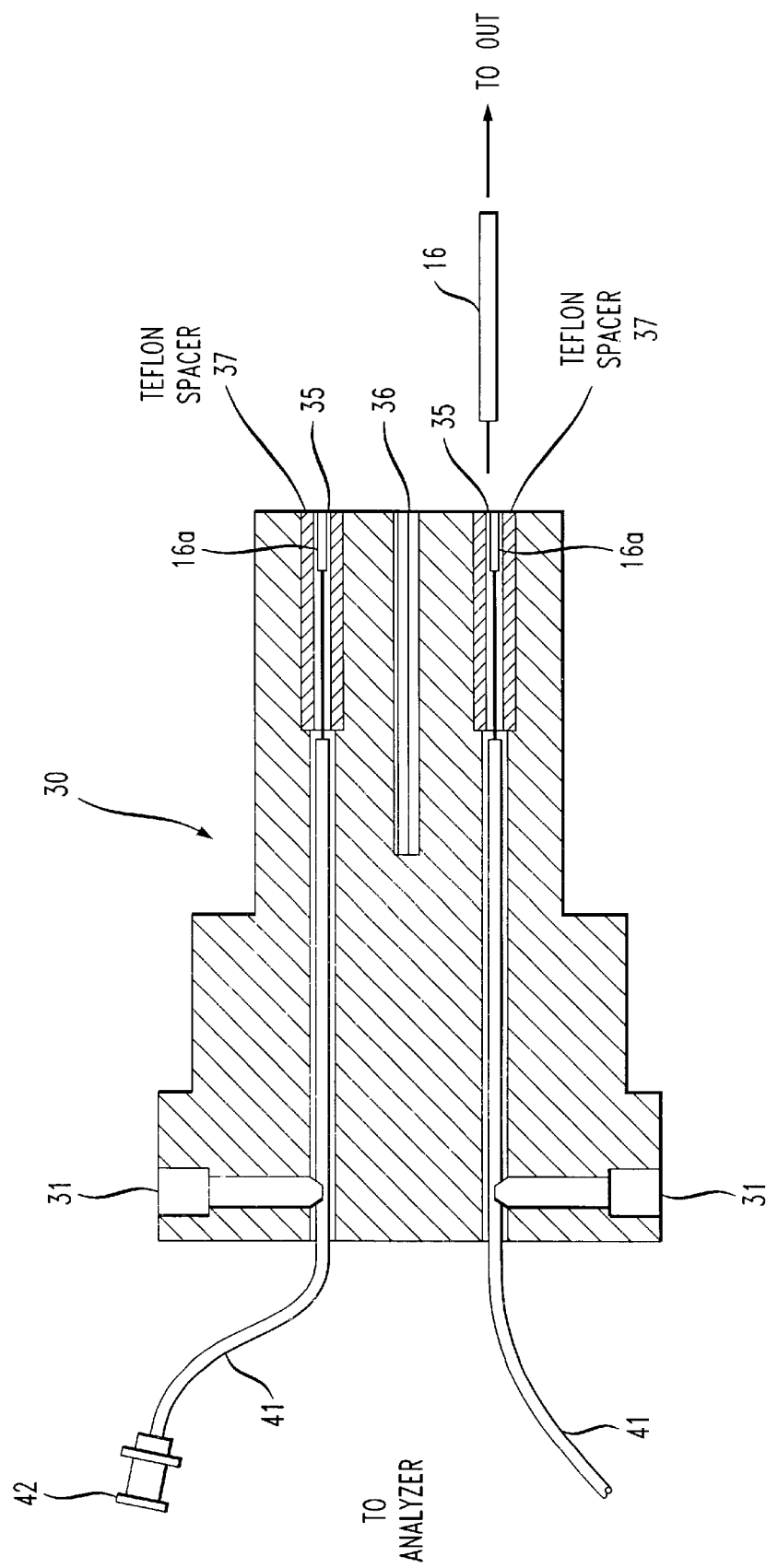
FIG. 4(e) is a cross-sectional view along axis A—A of a portion of the test fixture of FIG. 4(d)
Figure 7:
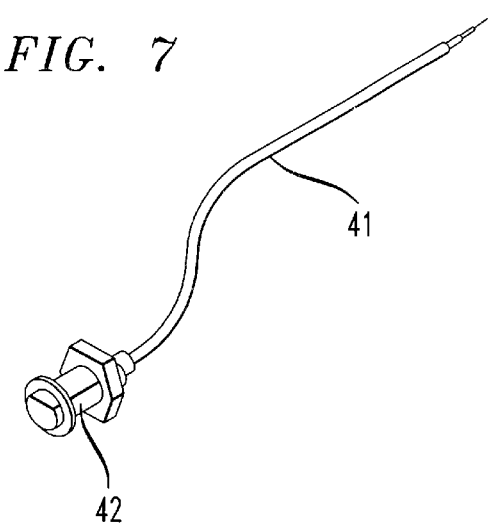
FIG. 7 is an illustration of a semi-rigid coaxial cable for use with the present invention.

As best shown in FIG. 4(e), precision connectors 16a are affixed to one end of the semi-rigid coaxial cable 41 (see FIG. 7) and ground pin 29 for receiving wires 16 which originate from the DUT or a grounding wire (not shown) for calibration purposes, respectively. Inserted into each wire receiving hole 35 and ground pin hole 35a are Teflon spacers 37 (see FIG. 4(d)) which partially extend into the front end of the single stock 30 and form a portion of a coaxial like structure (upon insertion of a semi-rigid coaxial cable 41 or ground pin 29 into the test fixture 26, see FIG. 4(e), for example). Here, the single stock 30 forms an outer shield of the coaxial structure and the Teflon spacer 37 forms a dielectric spacer. With the Teflon spacers 37 in the single stock 30 (as shown in FIG. 4(e)), an electrical connection is formed between a wire of the DUT and a corresponding center conductor of semi-rigid coaxial cable 41 (also see FIG. 3) which is inserted into wire receiving hole 35. The total number of wire receiving holes 35 (FIG. 4(d)) may vary depending on the type of twisted-pair cable 16 being tested. In the preferred embodiment of the present invention, there are twelve wire receiving holes 35, two for each semi-rigid coaxial cable 41 and a third for calibration purposes, i.e., for a grounding pin 29.

Figure 6A:
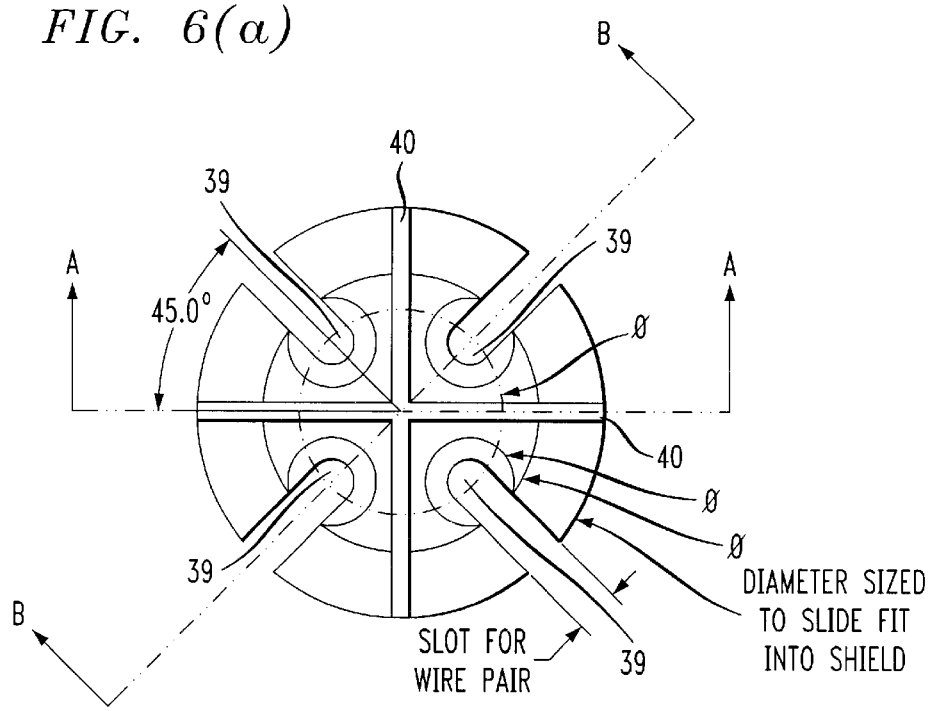
FIGS. 6(a) through 6(d) are top, perspective and cross-sectional illustrations of the insulating cap according to one embodiment of the present invention.
Figure 6B:
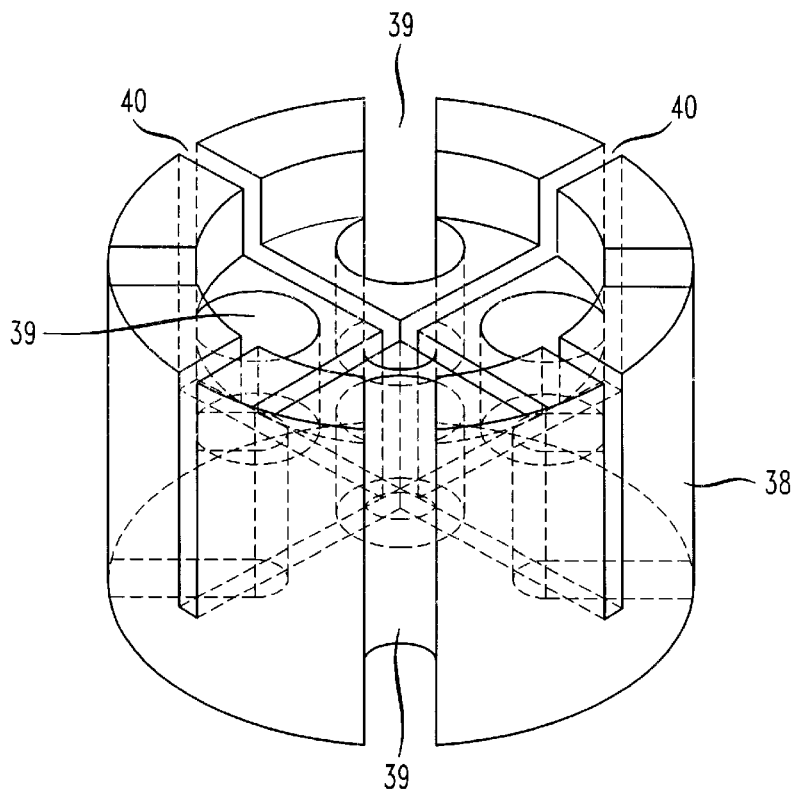
Figure 6C:
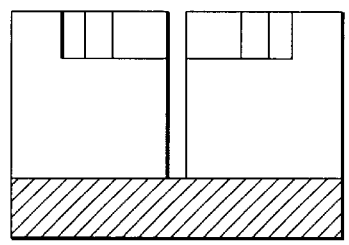
Figure 6D:
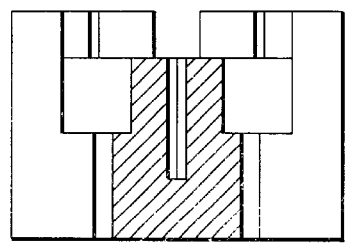
Figure 15:
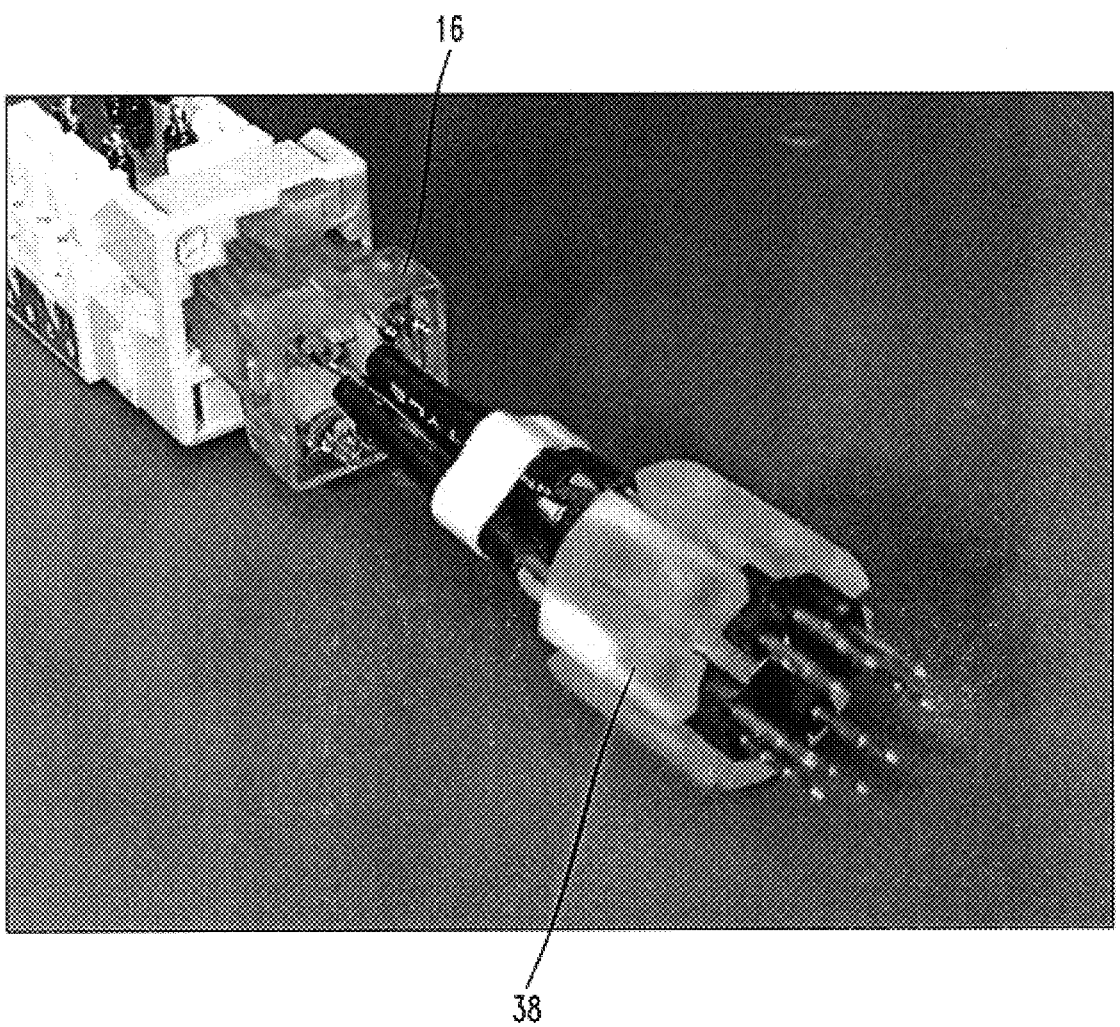
FIG. 15 is a perspective view of the insulating cap of FIGS. 6(a) through 6(d) with wires of a DUT placed therein.
Figure 18:
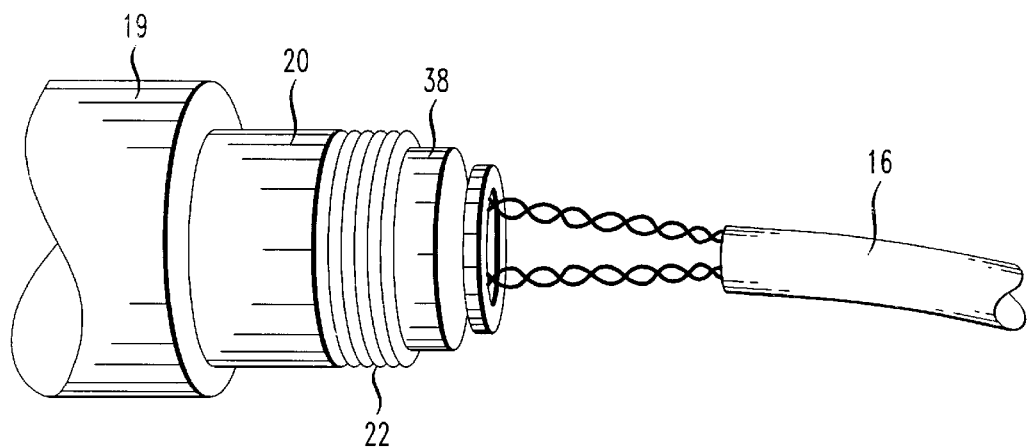
FIG. 18 is a side view of the insulating cap of FIGS. 6(a) through 6(d) and wire of a DUT mounted in the shield of FIGS. 5(a) and 5(b)

FIGS. 6(a) through 6(d) illustrate an insulating cap 38 which is located within insulating clamp 15 shown in FIG. 2. The cap 38 is used to hold wires 16 of the DUT in a fixed configuration and to minimize fan out. Because the cap 38 holds the wires 16 rigidly in fixed positions, the reproducibility of test results is maximized (as shown in FIG. 15). As indicated in FIGS. 6(a) and 6(b), the insulating cap 38 has holes 39 extending therethrough in a longitudinal direction. The holes 39 are configured to be aligned with corresponding holes 35 in the front of the surface 34 of single stock 30 (FIG. 4(d)). Each hole 39 receives a respective wire from a twisted pair cable 16. As an alternative to holes 39, slots or other wire holding or clamping configurations may be used. The insulating cap 38 also has a pair of receiving channels 40 which extend in a substantially lengthwise direction and are arranged to receive shield walls 21 of shield 20 when the cap 38 is mounted at the end of shield clamp 19. This permits the shield 20 to slide over the insulating cap 38 so that the interior walls isolate the wire pairs held within the cap from each other (as shown in FIG. 18). The insulating cap 38 is manufactured from a nonmetallic insulating material, for example plastic, where the preferred material is plexiglas. In order to connect a device to be tested to the test fixture sub assembly 14, the insulating cap 38 is placed into the shield 20 so that the receiving channels 40 mate in a corresponding manner with the walls 21 of the shield 20. As will be appreciated, the arrangement of the walls and corresponding slots depends on the number and configuration of the receiving holes 35.

Figure 8:
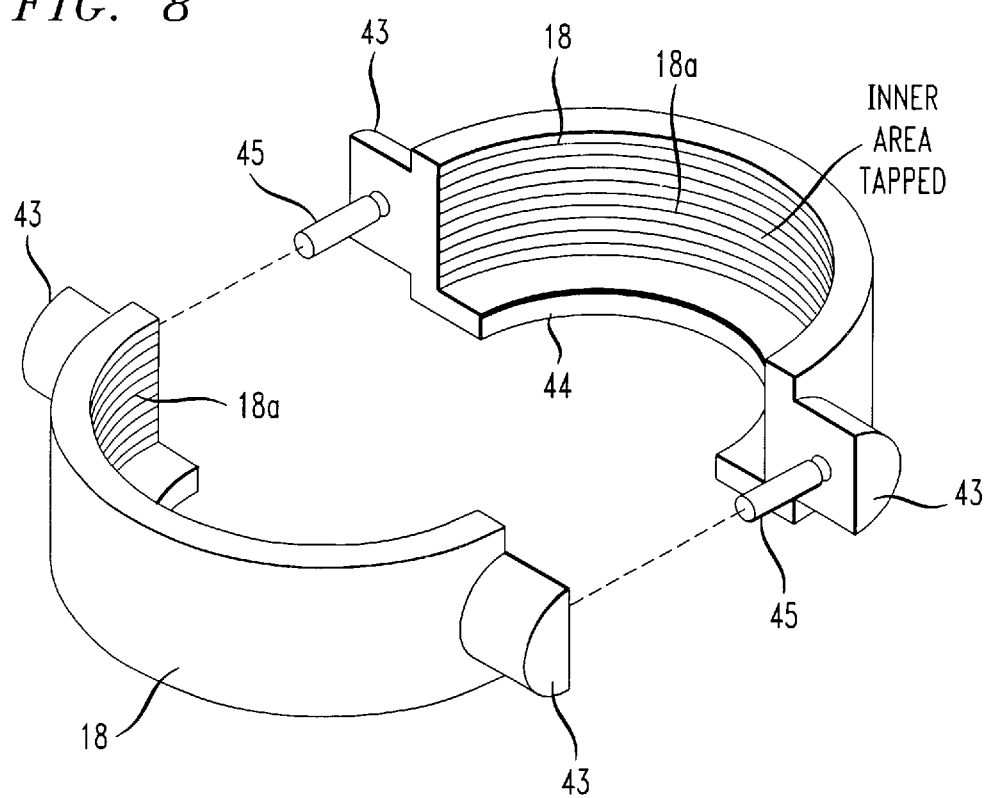
FIG. 8 is a perspective view of a split cap assembly according to the present invention.
Figure 19:
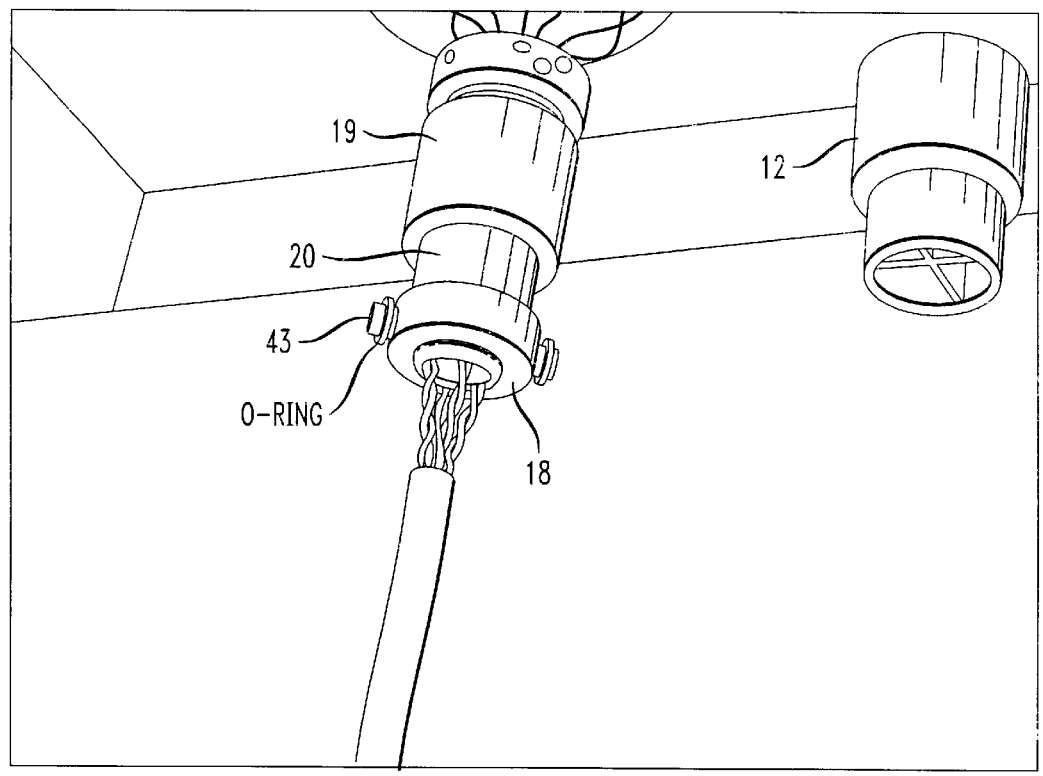
FIG. 19 is a top perspective view of the split cap assembly mounted to the shield, while the insulating cap is mounted in the shield of FIGS. 5(a) and 5(b)
Figure 20:
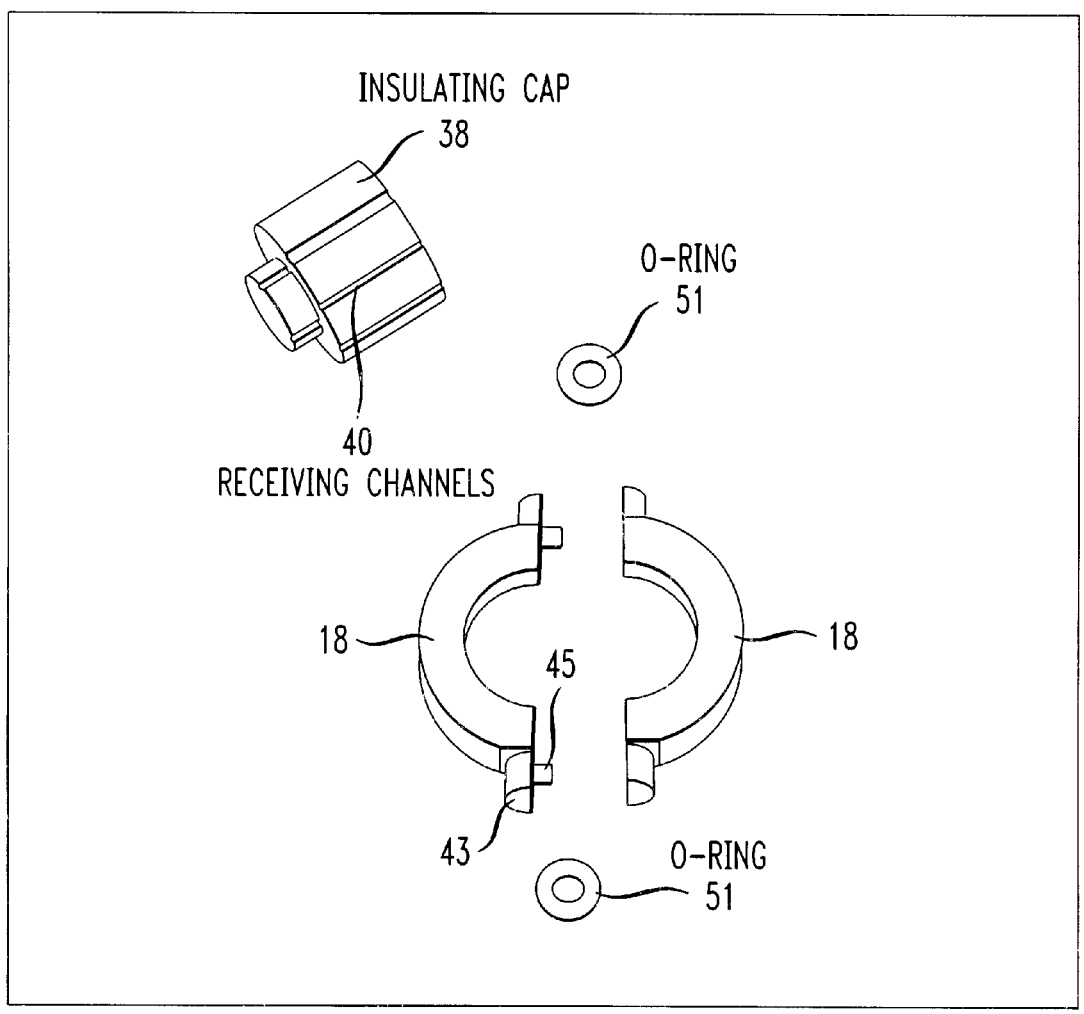
FIG. 20 is an illustration of the parts of the insulating cap of FIGS. 6(a) through 6(d) and the split cap assembly of FIG. 8.

FIGS. 3, 8 and 20 illustrate a split clamp assembly 18 for use with the test fixture sub assembly 14 to secure the insulating cap 38 to the shield 20. The split cap assembly 18 is comprised of two opposing halves to facilitate placement of the cap around the wires 16 of a DUT. Each half of the clamp 18 has matching threads 18a which mate with the threaded area 22 on shield 20. Before bringing the two halves of the split clamp assembly 18 together, the clamp parts 18 are placed around the wires 16 of the DUT. The halves are then secured to each other. Then the assembled split clamp assembly 18 is screwed onto the threaded area 22 of the shield 20. This pushes the cap 38 into the shield 20 so that its receiving channels 40 are firmly located about walls 21, thus rigidly locking the insulating cap 38 to the shield 20 (as shown in FIG. 19). As a result, locking of the insulating cap 38 after it is axially slid into the shield 20 is achieved, which further contributes to the rigidity of the test fixture subassembly 14.

Each half of the split clamp assembly 18 also possesses a circumferential lip surface 44 and tabs 43 which are used to secure the two halves together. Preferably, this is achieved by using elastic O-rings 51 which are placed around the tabs 43 of the split cap assembly 18 when the two halves are brought together. However, other locking mechanisms may also be used.

Figure 10:
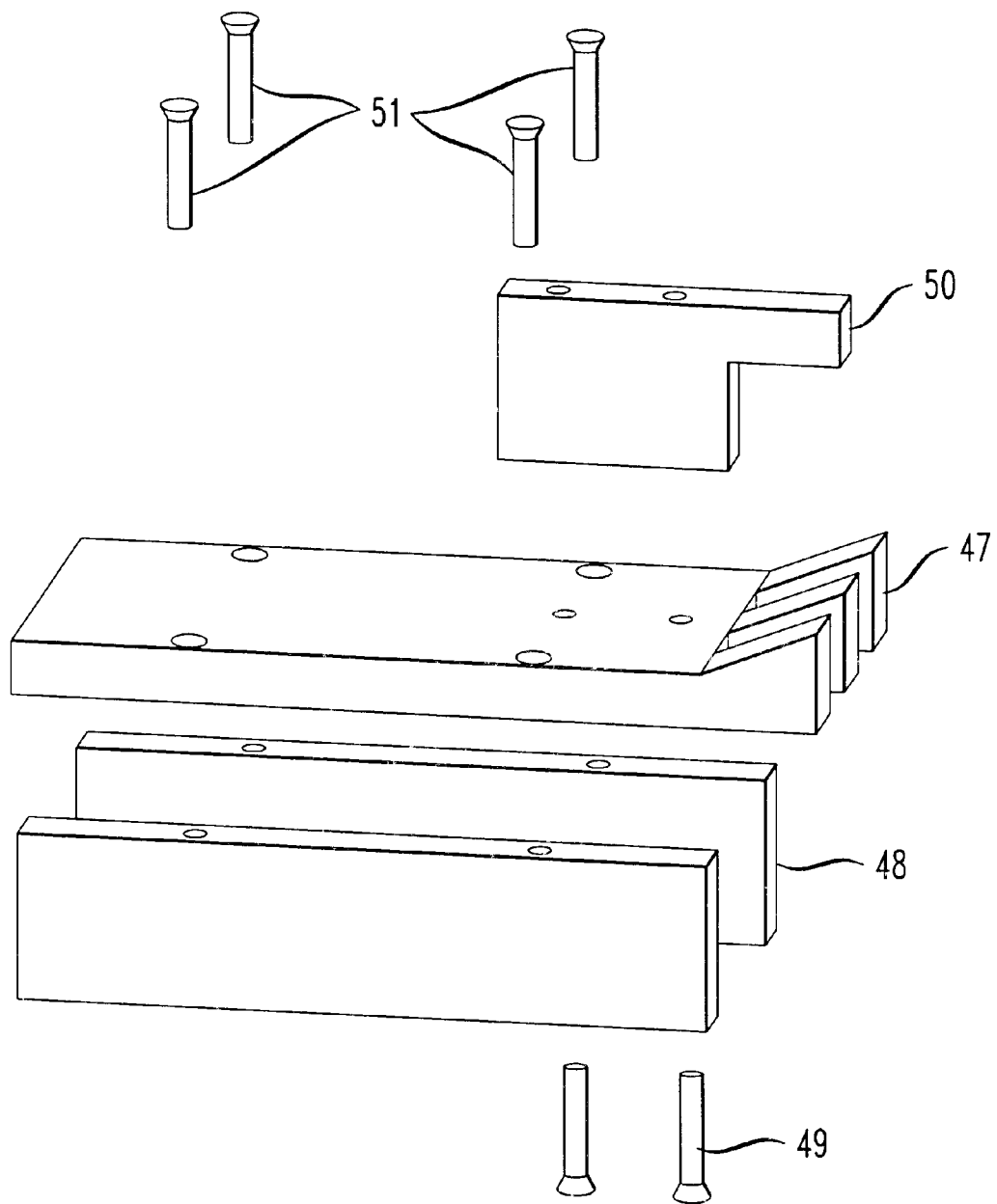
FIG. 10 is an exploded view of a pry bar for use with the present invention.
Figure 14:
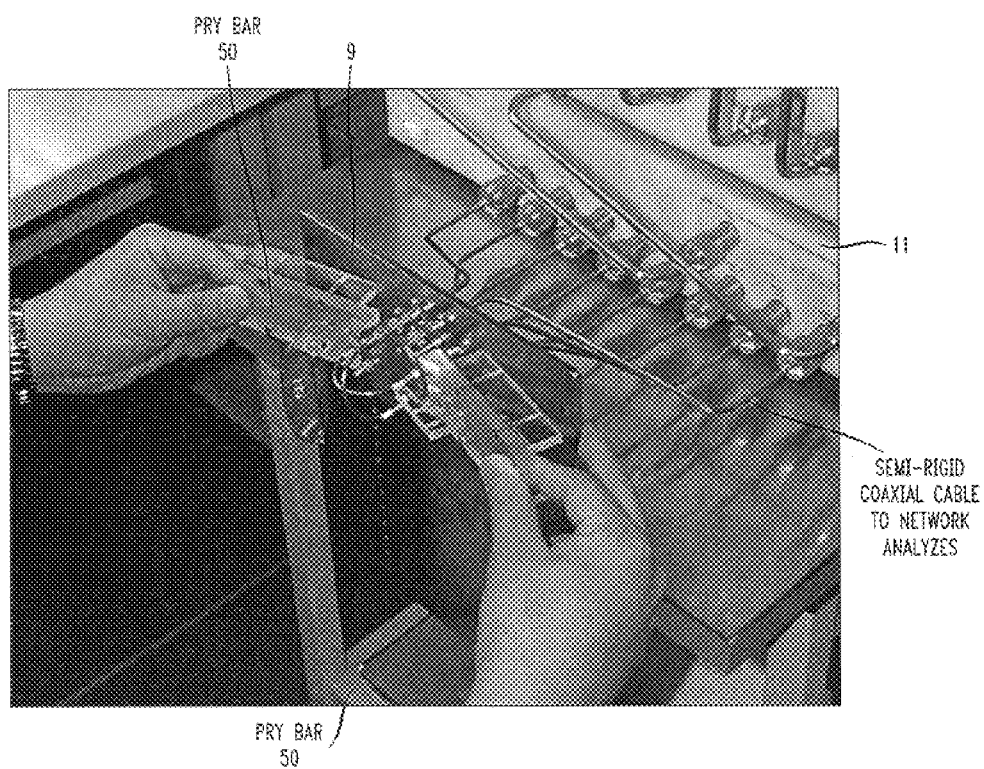
FIG. 14 is a perspective view illustrating use of pry bars to remove the mechanical fixture of FIG. 13 from the baseplate/grounding assembly.

Of note, because the mechanical fixture 10 is necessarily rigid and all connections are snug, it may be necessary to utilize a pry bar 50 (shown in FIG. 10) to remove the mechanical fixture 10 from the base plate 9. Preferably, two pry bars are used, where each pry bar 50 is placed on diametrically opposing sides of the bulkhead 9 and moved in a fulcruming manner to thereby release (i.e., unsnap) the mechanical fixture 10 from the base plate (as shown in FIG. 14).

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A mechanical fixture for connecting sets of wires from a device under test to inputs of a test device, comprising:

a test fixture having first and second ends;

a plurality of conduits passing through the test fixture;

ports at the first end electrically connected to respective ports on the second end; and a sliding shield axially mounted to the first end of the test fixture and having at least one internal electrically isolating wall;

wherein the plurality of conduits each terminate in a port at each of the ends.

2. The mechanical fixture of claim 1, further comprising:

a shield clamp axially engaging the test fixture to prevent removal of the shield from the test fixture.

3. The mechanical fixture of claim 2, wherein said shield clamp comprises:

an internal engagement area disposed at a first end; and a circumferential lip disposed at an opposite end.

4. The mechanical fixture of claim 2, wherein said test fixture comprises:

first, second and third abutment surfaces having respective diameters;

wherein the surfaces abut each other in a staggered arrangement, the diameter of the third surface is less than the diameter of the second surface, the diameter of the second surface is less than the diameter of the first surface and mates with the shield clamp, and the third surface acts as a stop for the shield clamp.

5. The mechanical fixture of claim 4, wherein the second surface has a circumferential engagement area for receiving a complimentary internal engagement area of the shield clamp.

6. The mechanical fixture of claim 5, wherein the circumferential engagement area and the internal engagement area are screw threads.

7. The mechanical fixture of claim 4, wherein said third surface further comprises:

at least one receiving slot extending along a longitudinal axis of the test fixture.

8. The mechanical fixture of claim 7, wherein at least one receiving slot engages the at least one internal electrically isolating wall.

9. The mechanical fixture of claim 1, wherein the test fixture is comprised of brass.

10. The mechanical assembly of claim 2, further comprising:

a split cap assembly having a first engagement surface disposed in an inner surface; and an insulating cap having at least one receiving channel for engaging the at least one internal electrically isolating wall;

wherein said split cap assembly is removably affixed to the cylindrical shield and said shield axially and slidably engages an interior surface of the shield clamp.

11. The mechanical fixture of claim 10, wherein said sliding shield comprises:

a first corresponding engagement surface at a first end for mating with the first engagement surface disposed in the inner surface of the split cap assembly;

a circumferential collar at a second end;

wherein the internal electrically isolating wall extends longitudinally in an interior surface of the shield and engages with the at least one receiving channel in the insulating cap.

12. The mechanical fixture of claim 11, wherein said split cap comprises:

first and second complementary halves of the split cap;

a second engagement surface disposed on an inner surface of each respective complementary half for engagement with a second corresponding engagement surface disposed on an outer surface of the shield; and a pair of diametrically opposed tabs on each respective half for receiving O-rings to thereby clamp the complementary halves together.

13. The mechanical fixture of claim 12, wherein the first engagement surface, the first corresponding engagement surface, the second engagement surface and the second corresponding engagement surface are screw threads.

14. The mechanical fixture of claim 13, wherein the internal engagement area is a screw thread.

15. The mechanical fixture of claim 10, wherein said insulating cap comprises:

receiving channels for mating with the at least one internal electrically isolating wall of the shield; and said insulating cap having at least one hole equidistantly disposed and extending longitudinally therethrough for receiving wires of a device under test.

16. The mechanical interconnecting fixture of claim 11, further comprising:

a removable bar inserted into a rear end of the test fixture, said bar providing support for the mechanical fixture after insertion into a bulk head.

17. The mechanical fixture of claim 1, further comprising:

at least one semi-rigid coaxial cable; and a bulk head connected at a first end of the at least one coaxial cable to form a test fixture subassembly;

wherein the test fixture has wire receiving holes disposed in the first end of the test fixture, and the at least one semi-rigid coaxial cable is inserted into a respective wire receiving hole at the second end of the test fixture.

18. The mechanical fixture of claim 16, wherein eight semi-rigid coaxial cables are inserted into the respective receiving holes.

19. The mechanical fixture of claim 1, wherein the sets of wires are twisted pair cables.

20. The mechanical fixture of claim 1, wherein the corresponding ports on each side of the test fixture are electrically connected to respective ports on the other side of the test fixture.

21. The mechanical fixture of claim 10, wherein the insulating cap is comprised of plexiglas.

\* \* \* \* \*